(12) United States Patent
Apel

(10) Patent No.: US 6,894,561 B2
(45) Date of Patent: May 17, 2005

(54) EFFICIENT POWER CONTROL OF A POWER AMPLIFIER BY PERIPHERY SWITCHING

(75) Inventor: Thomas R. Apel, Portland, OR (US)

(73) Assignee: TriQuint Semiconductor, Inc., Hillsboro, OR (US)

(*) Notice: Subject to any disclaimer, the term of this patent is extended or adjusted under 35 U.S.C. 154(b) by 0 days.

(21) Appl. No.: 10/608,251

(22) Filed: Jun. 27, 2003

(65) Prior Publication Data

US 2004/0056711 A1 Mar. 25, 2004

Related U.S. Application Data

(60) Provisional application No. 60/412,342, filed on Sep. 20, 2002.

(51) Int. Cl.[7] .............................. H03F 1/14; H03F 3/68
(52) U.S. Cl. ..................................... 330/51; 330/124 R
(58) Field of Search .............................. 330/51, 124 R, 330/129, 134, 289, 295

(56) References Cited

U.S. PATENT DOCUMENTS

| | | | |
|---|---|---|---|
| 4,598,252 A | * | 7/1986 | Andricos ...................... 330/51 |
| 5,541,554 A | | 7/1996 | Stengel et al. |
| 5,880,633 A | | 3/1999 | Leizerovich et al. |
| 5,886,575 A | | 3/1999 | Long |
| 6,137,355 A | | 10/2000 | Sevic et al. |
| 6,255,906 B1 | * | 7/2001 | Eidson et al. ............ 330/124 R |
| 6,262,629 B1 | | 7/2001 | Stengel et al. |
| 6,329,877 B1 | | 12/2001 | Bowen et al. |
| 6,359,514 B1 | | 3/2002 | King et al. |
| 6,374,092 B1 | | 4/2002 | Leizerovich et al. |
| 2002/0093383 A1 | | 7/2002 | Thompson |
| 2002/0132652 A1 | | 9/2002 | Steel et al. |
| 2002/0135425 A1 | | 9/2002 | Kim et al. |

* cited by examiner

Primary Examiner—Steven J. Mottola
(74) Attorney, Agent, or Firm—Bever, Hoffman & Harms, LLP; E. Eric Hoffman

(57) ABSTRACT

A power amplifier having a first amplifier output stage and a parallel second amplifier output stage is provided. The first amplifier output stage is enabled (i.e., fully biased) during both high power and low power operating modes. The second amplifier output stage is disabled during the low power operating mode, and enabled during the high power operating mode. Because neither the first nor second amplifier output stage is operated in an extremely low quiescent current state, the linearity of the power amplifier is maintained for both high power and low power operating modes.

13 Claims, 9 Drawing Sheets

US 6,894,561 B2

EFFICIENT POWER CONTROL OF A POWER AMPLIFIER BY PERIPHERY SWITCHING

RELATED APPLICATIONS

The present invention is a continuation-in-part of Provisional U.S. Patent Application Ser. No. 60/412,342, "Efficient Power Control by Periphery Switching", by Thomas R. Apel, which was filed on Sep. 20, 2002.

BACKGROUND OF THE INVENTION

1. Field of the Invention

The present invention relates to a method and structure for improving the efficiency and linearity of a power amplifier (PA). More specifically, the present invention relates to a method and structure for turning off a subset of the transistors in a power amplifier during low power operation.

2. Related Art

Linear power amplifiers are often operated in class AB mode. Operation in class AB mode provides for reduced power supply current to the power amplifier as the power of the input signal is reduced. The power supply current can be reduced until a minimum quiescent current is reached. The direct current (DC) power to radio frequency (RF) power efficiency degrades as the power of the input signal is reduced. Prior art linear power amplifiers provide some improvement in low power efficiency by stepping the quiescent current to a lower level for low power operation. However, the linearity of the power amplifier is degraded at very low quiescent current levels.

FIG. 1 is a circuit diagram illustrating a conventional power amplifier 100, which includes amplifier stages 101–102 and associated bias circuits 111–112. Each of amplifier stages 101–102 includes a parallel-connected set of NPN bipolar transistors 103–104, respectively. Ballast resistors 105–106 are connected to the bases of transistor sets 103–104. In general, the bases of transistor sets 103–104 are configured to receive a radio frequency input signal (e.g., $RF_{IN}$). The emitters of transistor sets 103–104 are coupled to ground, and the collectors of transistors sets 103–104 are configured to provide an RF output signal (e.g., $RF_{OUT}$) to an output terminal of the associated amplifier stage.

When the input signal $RF_{IN}$ is controlled to be a high power signal (i.e., during high-power operation), a HI/LO control signal is activated to a first logic state. In response, bias voltage control circuits 111–112 provide relatively high bias voltages $V_{BIAS1}$–$V_{BIAS2}$. As a result, amplifier stages 101–102 operate in a linear manner in response to the $RF_{IN}$ signal. Conversely, when the input signal $RF_{IN}$ is controlled to be a low power signal (i.e., during low-power operation), the HI/LO control signal is deactivated to a second logic state. In response, bias control circuits 111–112 provide relatively low bias voltages $V_{BIAS1}$–$V_{BIAS2}$. Under these conditions, amplifier stages 101–102 consume less power, but the linearity of power amplifier 100 is degraded under these conditions.

It would therefore be desirable to have an alternative to the extremely low quiescent current operation (i.e., "current starved" operation) that results when the power supply current to the power amplifier is reduced as the power of the input signal is reduced.

SUMMARY

Accordingly, the present invention provides a power amplifier having a first amplifier output stage and a parallel-connected second amplifier output stage. The first amplifier output stage is enabled (i.e., fully biased) during both high power and low power operating modes. The second amplifier output stage is disabled during the low power operating mode, and enabled during the high power operating mode. Because neither the first nor second amplifier output stage is operated in a low quiescent current state, the linearity of the power amplifier is maintained for both high power and low power operating modes.

In a particular embodiment, one or more additional amplifier output stages can be connected in parallel with the first and second amplifier output stages, thereby enabling intermediate power operating modes.

The present invention will be more fully understood in view of the following description and drawings.

DETAILED DESCRIPTION

Figure 1:
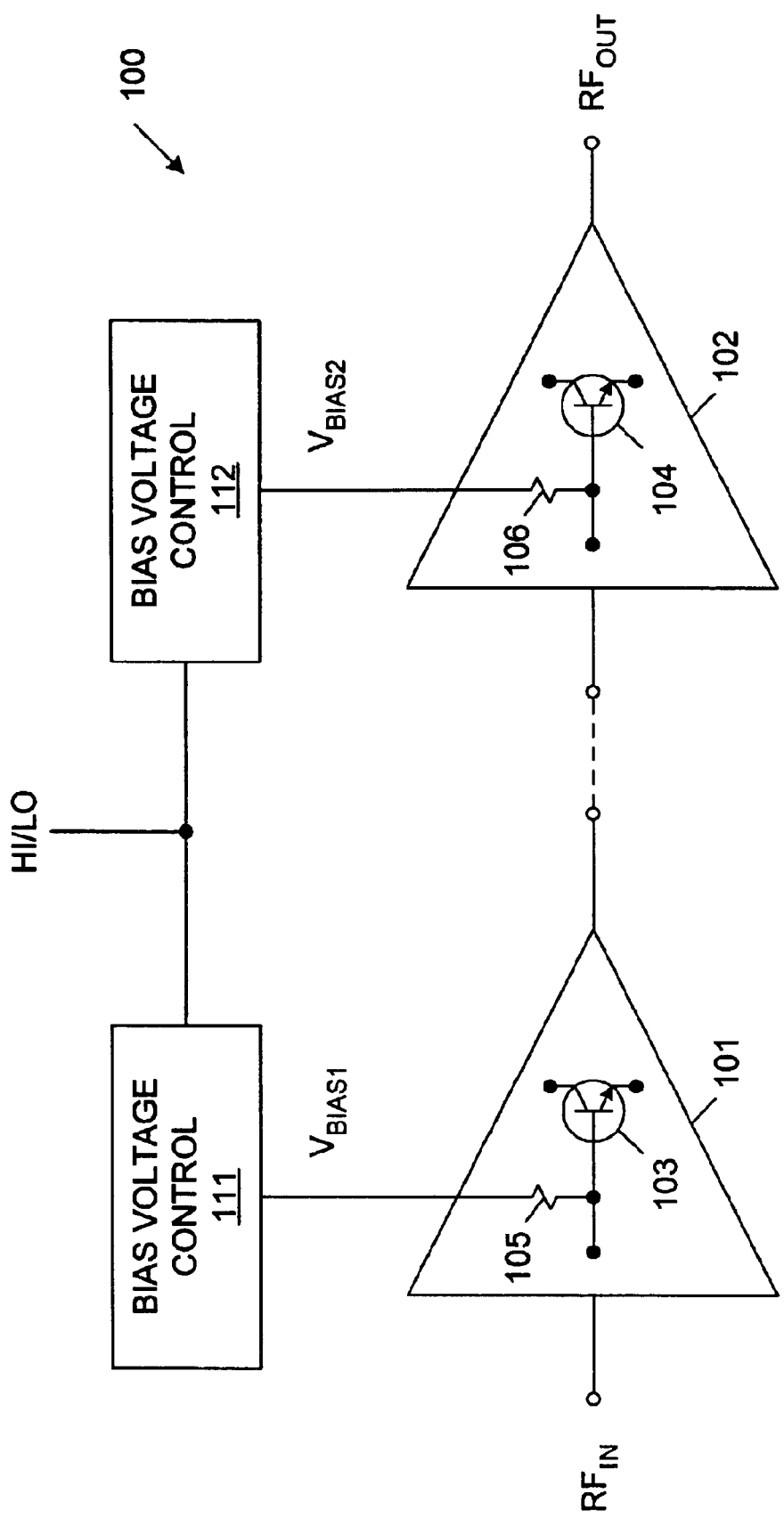
FIG. 1 is a circuit diagram of a conventional power amplifier.
Figure 2:
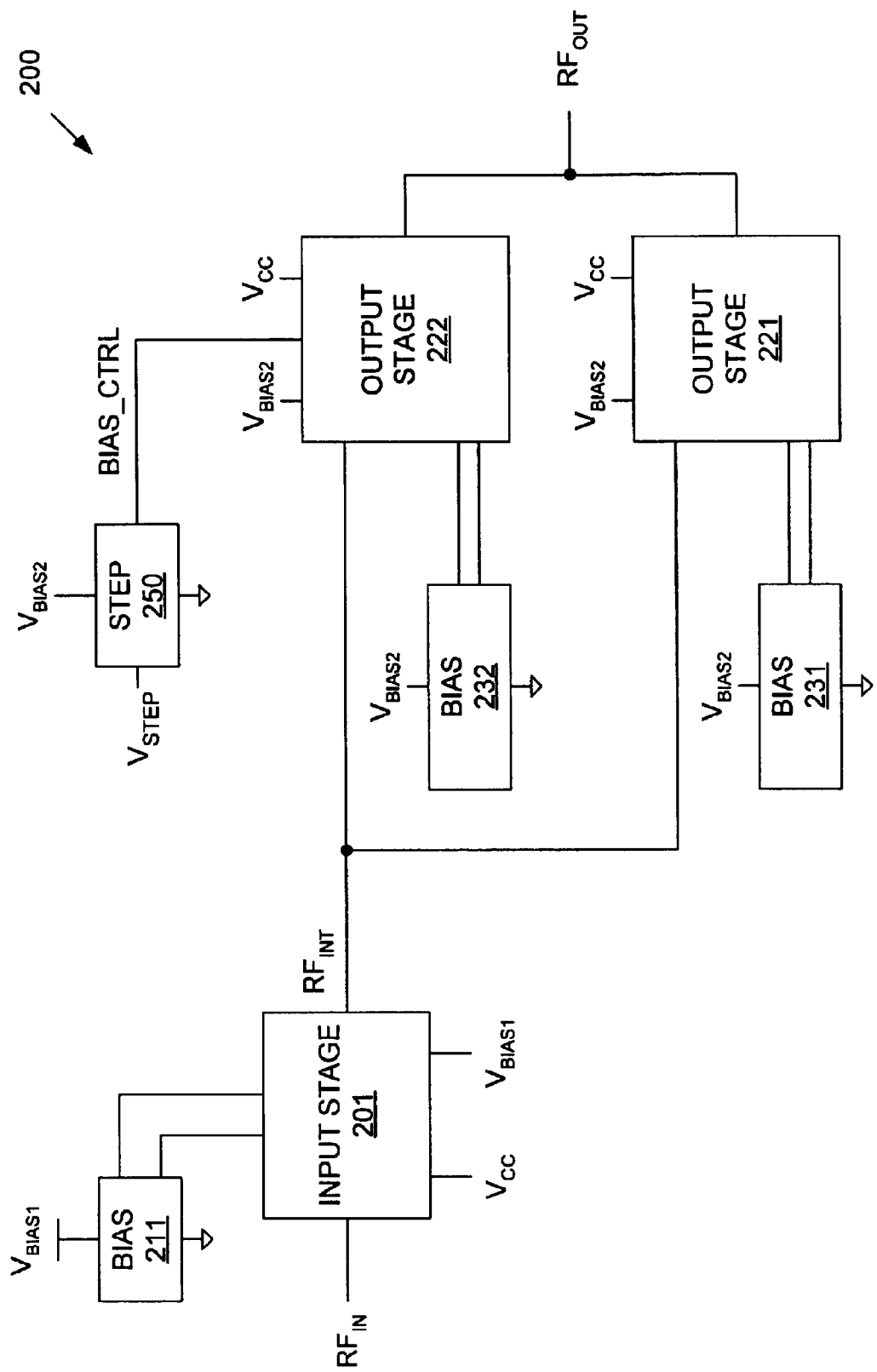
FIG. 2 is a circuit diagram of a power amplifier in accordance with one embodiment of the present invention.

FIG. 2 is a circuit diagram of a power amplifier 200 in accordance with one embodiment of the present invention. Power amplifier 200 includes amplifier input stage 201, input stage bias circuit 211, amplifier output stages 221–222, output stage bias circuits 231–232, and step control circuit 250. In general, bias circuits 211, 231 and 232 cause DC bias voltages to be applied the bases of RF transistors present in input stage 201, output stage 221 and output stage 222, respectively. A radio frequency (RF) signal $RF_{IN}$ is applied to input stage 201. In response, input stage 201 provides an intermediate level RF signal $RF_{INT}$ to output stages 221 and 222.

If power amplifier 200 is operating in a high power mode, step control circuit 250 enables output stage 222 (via the BIAS_CTRL signal). In this case, both of output stages 221 and 222 provide an RF output signal $RF_{OUT}$ in response to the intermediate level RF signal $RF_{INT}$.

If power amplifier is operating in a low power mode, step control circuit 250 disables output stage 222. In this case, only output stage 221 provides the output signal $RF_{OUT}$ in response to the intermediate RF signal $RF_{INT}$.

Advantageously, the RF transistors in output stage 221 always operate at a normal fully biased state. Similarly, the RF transistors in output stage 222 either operate at a normal fully biased state, or are disabled. In the low power state, the overall quiescent current is reduced by the ratio of the number of RF transistors in output stage 222 to the number of RF transistors in output stage 221. The advantage with this approach is in linearity. In all power states (high or low), the RF transistors are adequately biased for linear performance. In the described embodiment, the input and output interfaces to all RF transistor cells are all maintained. Thus, impedance matching and loading are unchanged, regardless of the power state.

Figure 3:
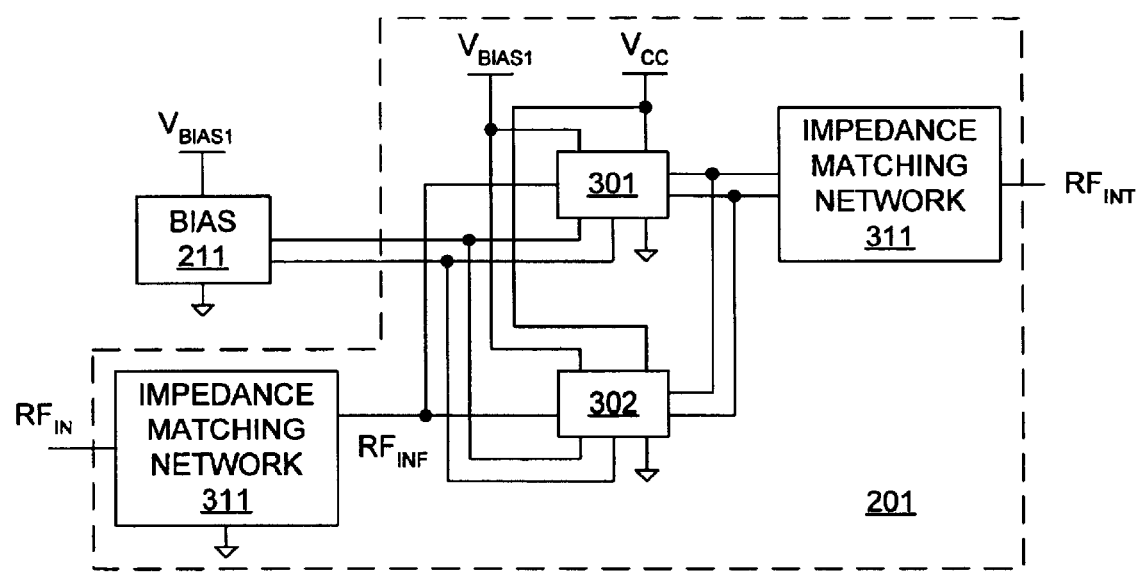
FIG. 3 is a block diagram of an amplifier input stage and an input stage bias circuit of the power amplifier of FIG. 2, in accordance with one embodiment of the present invention.

Power amplifier 200 will now be described in more detail. FIG. 3 is a block diagram of amplifier input stage 201 and input stage bias circuit 211, in accordance with one embodiment of the present invention. Amplifier input stage 201 includes input cells 301–302 and impedance matching networks 311–312. Impedance matching network 311 provides a filtered and matched RF signal $RF_{INF}$ to input cells 301–302 in response to the input RF signal $RF_{IN}$. Input cells 301–302, which are connected in a parallel configuration, provide amplified signals to impedance matching network 312. In response, impedance matching network 312 provides the intermediate RF signal $RF_{INT}$.

Figure 4:
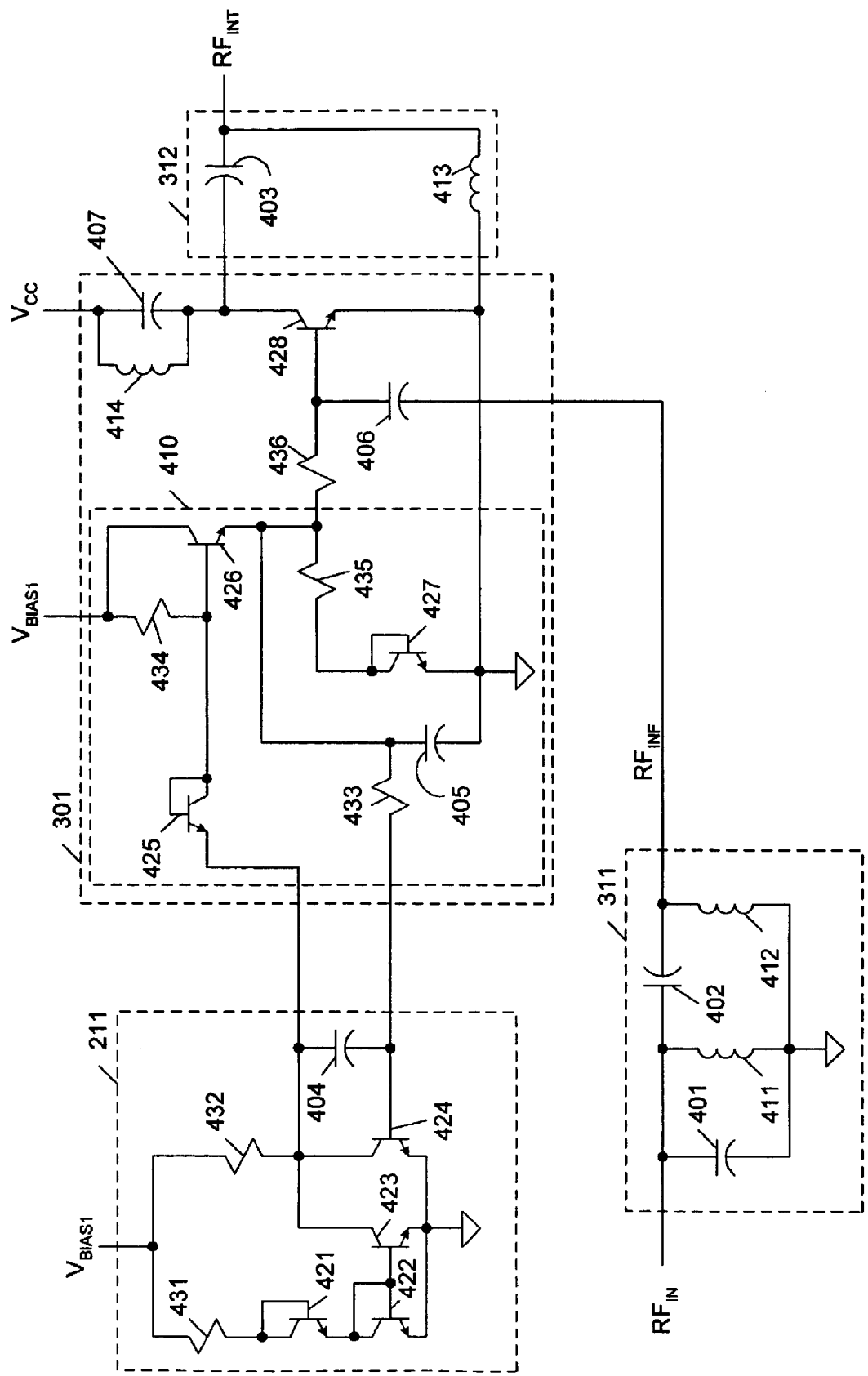
FIG. 4 is a circuit diagram of the input stage bias circuit, an input cell, and impedance matching networks in accordance with one embodiment of the present invention.

FIG. 4 is a circuit diagram illustrating bias circuit 211, input cell 301, and impedance matching circuits 311–312 in accordance with one embodiment of the present invention. Note that input cell 302 (not shown in FIG. 4) is identical to input cell 301. Impedance matching circuit 311 includes capacitors 401–402 and inductors 411–412. Impedance matching circuit 312 includes capacitor 403 and inductor 413. Bias circuit 211 includes capacitor 404, NPN bipolar transistors 421–424 and resistors 431–432. Input cell 301 includes capacitors 405–407, inductor 414, NPN bipolar transistors 425–428 and resistors 433–436. In general, the $RF_{INF}$ signal is provided to the base of RF transistor 428. RF transistor 428 is biased by bias reference circuit 211 (which is common to both input cells 301 and 302), and distributed bias circuit 410 (which is specific to input stage 301, and includes capacitor 405, transistors 425–427 and resistors 433–435). Bias reference circuit 211 and distributed bias circuit 410 form a temperature adaptive bias circuit, which is described in more detail in commonly-owned, co-pending U.S. patent application Ser. No. 10/421,679, which is hereby incorporated by reference. In general, bias circuit 211 and distributed bias circuit 410 provide a bias voltage on the base of RF transistor 428 in response to a first bias voltage $V_{BIAS1}$. When properly biased, RF transistor 428 provides a collector current, which when combined with a corresponding collector current in input cell 302, creates the $RF_{INT}$ signal.

Figure 5:
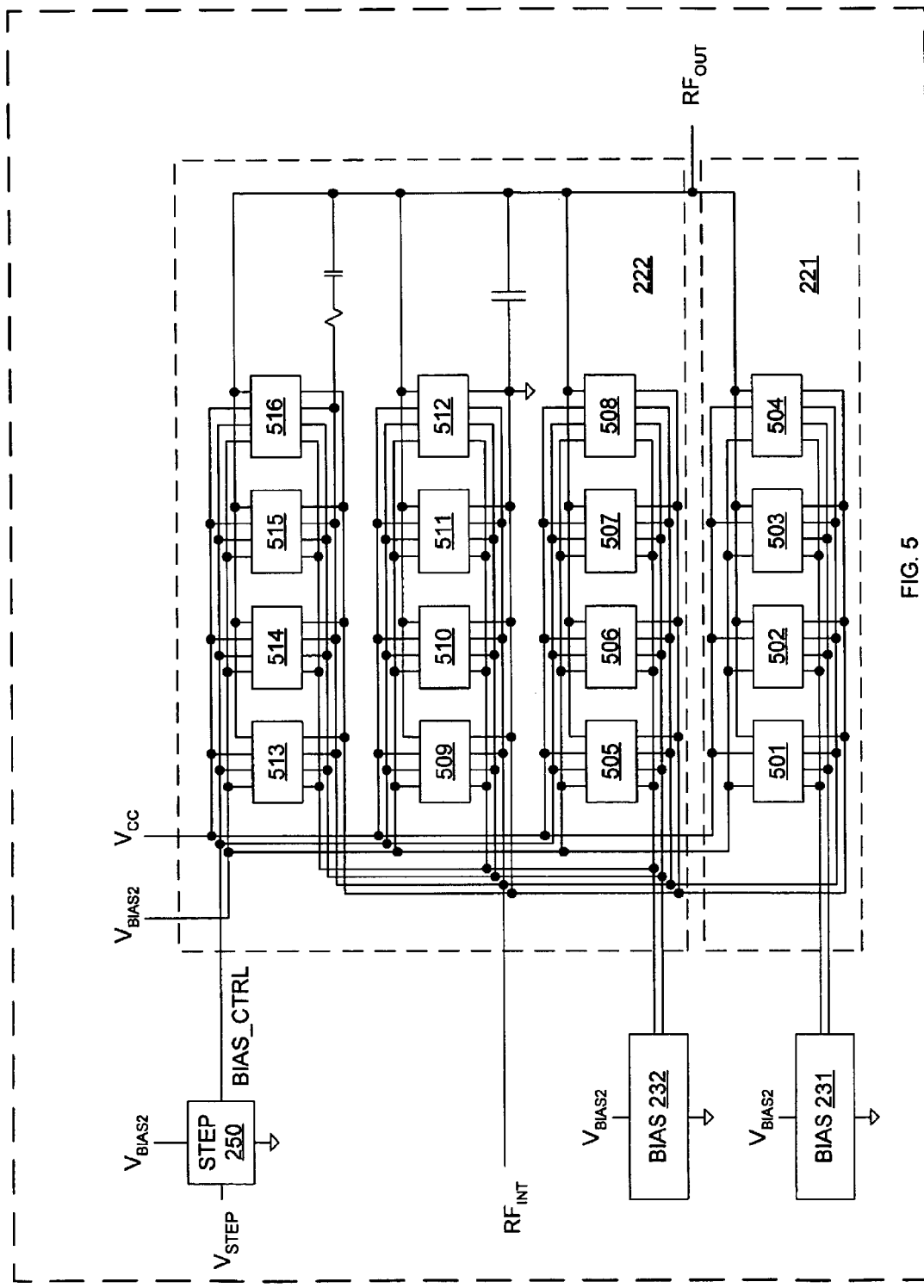
FIG. 5 is a block diagram of amplifier output stages, bias circuits and a step control circuit of the power amplifier of FIG. 2, in accordance with one embodiment of the present invention.

FIG. 5 is a block diagram of amplifier output stages 221–222, bias circuits 231–232 and step control circuit 250. Amplifier output stage 221 includes four output cells 501–504. As described in more detail below, output cells 501–504 are enabled during both low and high power operating modes. Amplifier output stage 222 includes twelve output cells 505–516. As described in more detail below, output cells 505–516 are enabled during the high power operating mode, and disabled during the low power operating mode. Output cells 501–516 are configured to receive the $RF_{INT}$ signal in parallel, and provide the RF output signal, $RF_{OUT}$, in parallel.

Figure 6:
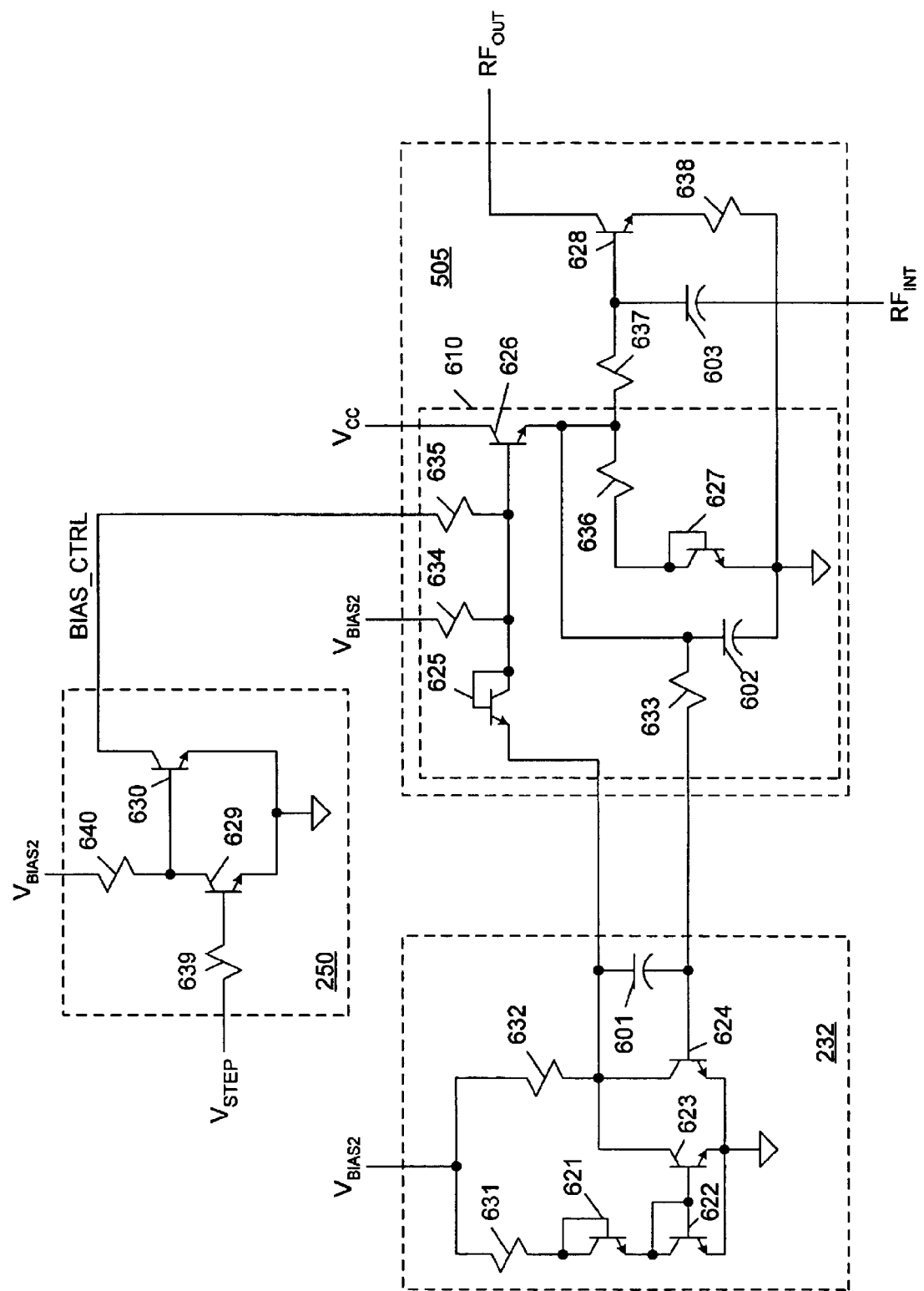
FIG. 6 is a circuit diagram of an output cell, a bias circuit and a step control circuit, in accordance with one embodiment of the present invention.

FIG. 6 is a circuit diagram of output cell 505, bias circuit 232 and step control circuit 250, in accordance with one embodiment of the present invention. Note that output cells 506–516 (not illustrated in FIG. 6) are identical to output cell 505. Bias circuit 232 includes capacitor 601, NPN bipolar transistors 621–624 and resistors 631–632. Output stage 505 includes capacitors 602–603, NPN bipolar transistors 625–628 and resistors 633–638. Step control circuit 250 includes NPN bipolar transistors 629–630 and resistors 639–640.

In general, the $RF_{INT}$ signal is provided to the base of RF transistor 628 via coupling capacitor 603. The base of RF transistor 628 is DC biased by bias circuit 232 (which is common to output cells 505–516), and distributed bias circuit 610 (which is specific to output cell 505). Bias circuit 232 and distributed bias circuit 610 form a temperature adaptive bias circuit, which is similar to the temperature adaptive bias circuit formed by bias circuit 211 and distributed bias circuit 410 (FIG. 4). In general, bias circuit 232 and distributed bias circuit 610 provide a bias voltage on the base of RF transistor 628 in response to a second bias voltage $V_{BIAS2}$. When step control circuit 250 allows output cell 505 to be properly biased, RF transistor 628 provides a collector current, which when combined with corresponding collector currents in output cells 501–504 and 506–516, creates the $RF_{OUT}$ signal. Resistor 638 provides optional emitter biasing of RF transistor 628.

Step control circuit 250 includes NPN bipolar transistors 629–630 and resistors 639–640. When operating in the high power state, the $V_{STEP}$ voltage has a logic high state, such that transistor 629 is turned on and transistor 630 is turned off. As a result, the BIAS_CTRL current is approximately equal to zero. Under these conditions, step control circuit 250 does not affect the operation of output cell 505 (or output cells 506–516). That is, bias circuits 232 and 610 operate to provide an appropriate DC bias voltage to the base of RF transistor 628, thereby enabling this transistor to contribute collector current to the $RF_{OUT}$ signal.

When operating in the low power state, the $V_{STEP}$ voltage has a logic low state, such that transistor 629 is turned off and transistor 630 is turned on. As a result, a significant BIAS_CTRL current is drawn from output cell 505 (through resistor 635) to ground. Under these conditions, transistor 626 turns off, thereby effectively disabling output cell 505 (and output cells 506–516). More specifically, when transistor 626 turns off, RF transistor 628 turns off due to insufficient DC bias on the base of this transistor.

Figure 7:
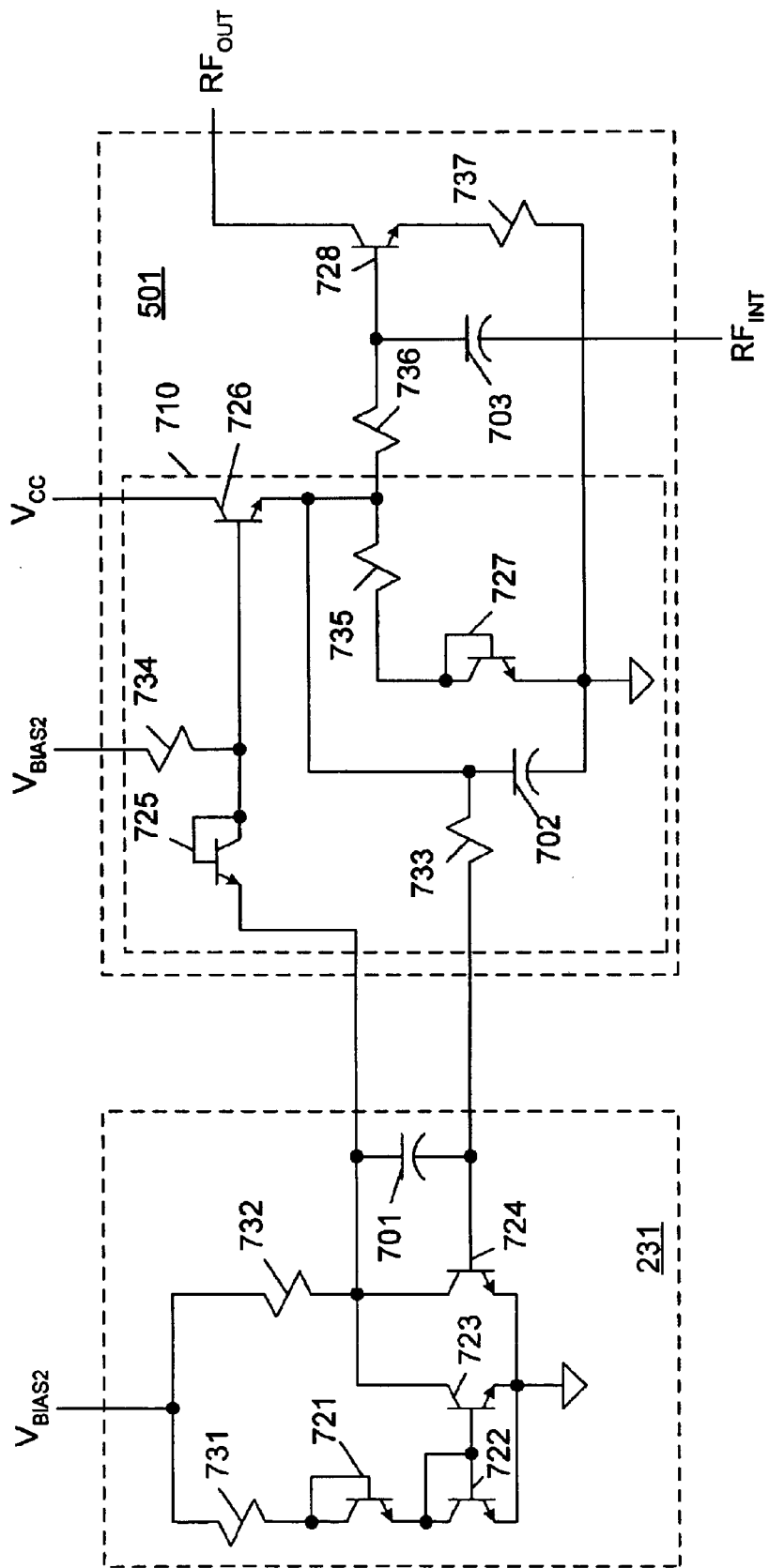
FIG. 7 is a circuit diagram of an output cell and a bias circuit, in accordance with one embodiment of the present invention.

FIG. 7 is a circuit diagram of output cell 501 and bias reference circuit 231, in accordance with one embodiment of the present invention. Note that output cells 502–504 (not illustrated in FIG. 7) are identical to output cell 501. Bias reference circuit 231 includes capacitor 701, NPN bipolar transistors 721–724 and resistors 731–732. Output cell 501 includes capacitors 702–703, NPN bipolar transistors 725–728 and resistors 733–737.

In general, the $RF_{INT}$ signal is provided to the base of RF transistor 728 via coupling capacitor 703. The base of RF transistor 728 is DC biased by bias reference circuit 231 (which is common to low power mode output cells 501–504), and distributed bias circuit 710 (which is specific to output cell 501). Bias circuit 231 and distributed bias circuit 710 form a temperature adaptive bias circuit, which is similar to the temperature adaptive bias circuit formed by bias circuit 232 and distributed bias circuit 610 (FIG. 6). In general, bias circuit 231 and distributed bias circuit 710 provide a bias voltage on the base of RF transistor 728 in response to a second bias voltage $V_{BIAS2}$. When properly biased, RF transistor 728 provides a collector current, which when combined with corresponding collector currents in output cells 501–504 and 506–516, creates the $RF_{OUT}$ signal. Resistor 737 provides optional emitter biasing of RF transistor 728. Notably, output cell 501 is not coupled to step control circuit 250. Thus, output cell 501 (and associated output cells 502–504) are enabled during both high and low power modes.

Figure 8:
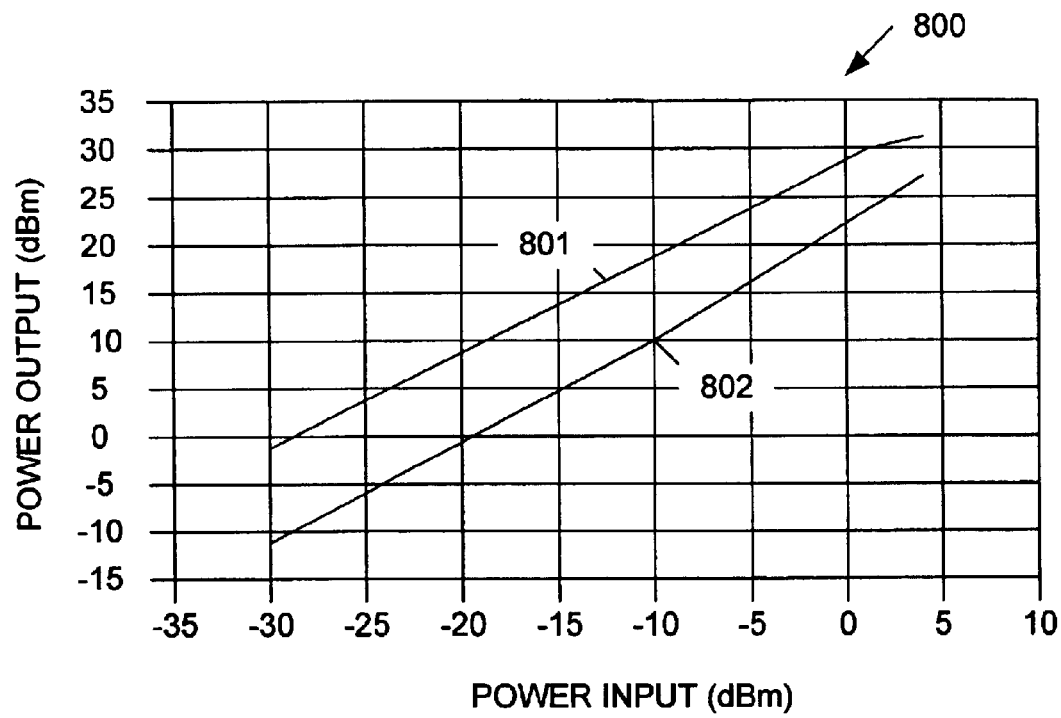
FIG. 8 is a graph illustrating RF input power versus RF output power for the power amplifier of FIG. 2 in a high power mode and a low power mode.

FIG. 8 is a graph 800 illustrating the RF input power versus the RF output power of power amplifier 200 for the high power mode and the low power mode. Line 801 represents operation in the high power mode, wherein all of the output cells 501–516 are enabled. Line 802 represents the low power mode, wherein output cells 501–504 are enabled and output cells 505–516 are disabled. Note that even though power amplifier 200 is operating at low power, the amplifier continues to operate with a high linearity.

Figure 9:
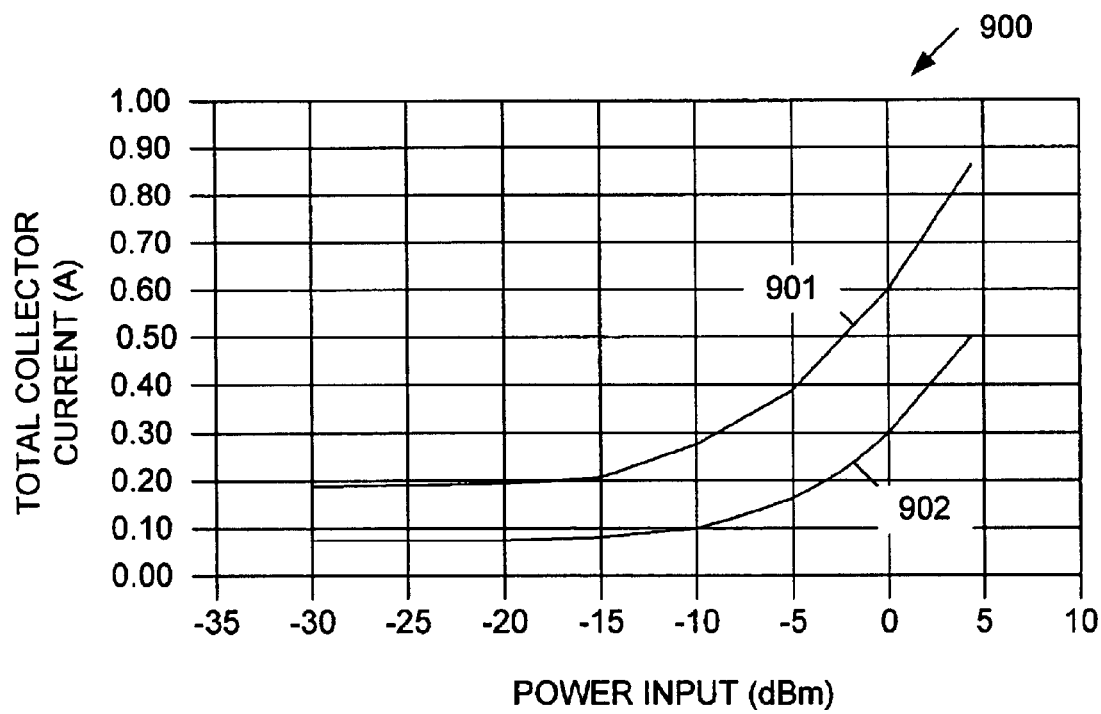
FIG. 9 is a graph illustrating RF input power versus collector current for the power amplifier of FIG. 2 in a high power mode and a low power mode.

FIG. 9 is a graph 900 illustrating the RF input power versus the collector current of the RF transistors in output cells 501–516. Line 901 represents operation in the high power mode, wherein all of the output cells 501–516 are enabled. Line 902 represents the low power mode, wherein output cells 501–504 are enabled and output cells 505–516 are disabled. FIG. 9 illustrates the improvement in efficiency in the low power mode, because a reduction in current translates to a reduction in power (V×I).

Although the present invention has been described in accordance with one output stage that is always enabled (output stage 221) and one output stage that is selectively enabled/disabled in view of the operating mode (output stage 222), it is understood that other configurations are possible. For example, in accordance with another embodiment of the present invention, output stage 221 can be enabled/disabled in a complementary manner with respect to output stage 222. Thus, during low power mode, output stage 221 is enabled and output stage 222 is disabled. Conversely, during high power mode, output stage 221 is disabled and output stage 222 is enabled. This embodiment could be implemented by providing a step control circuit (similar to step control circuit 250) for output stage 221.

Figure 10:
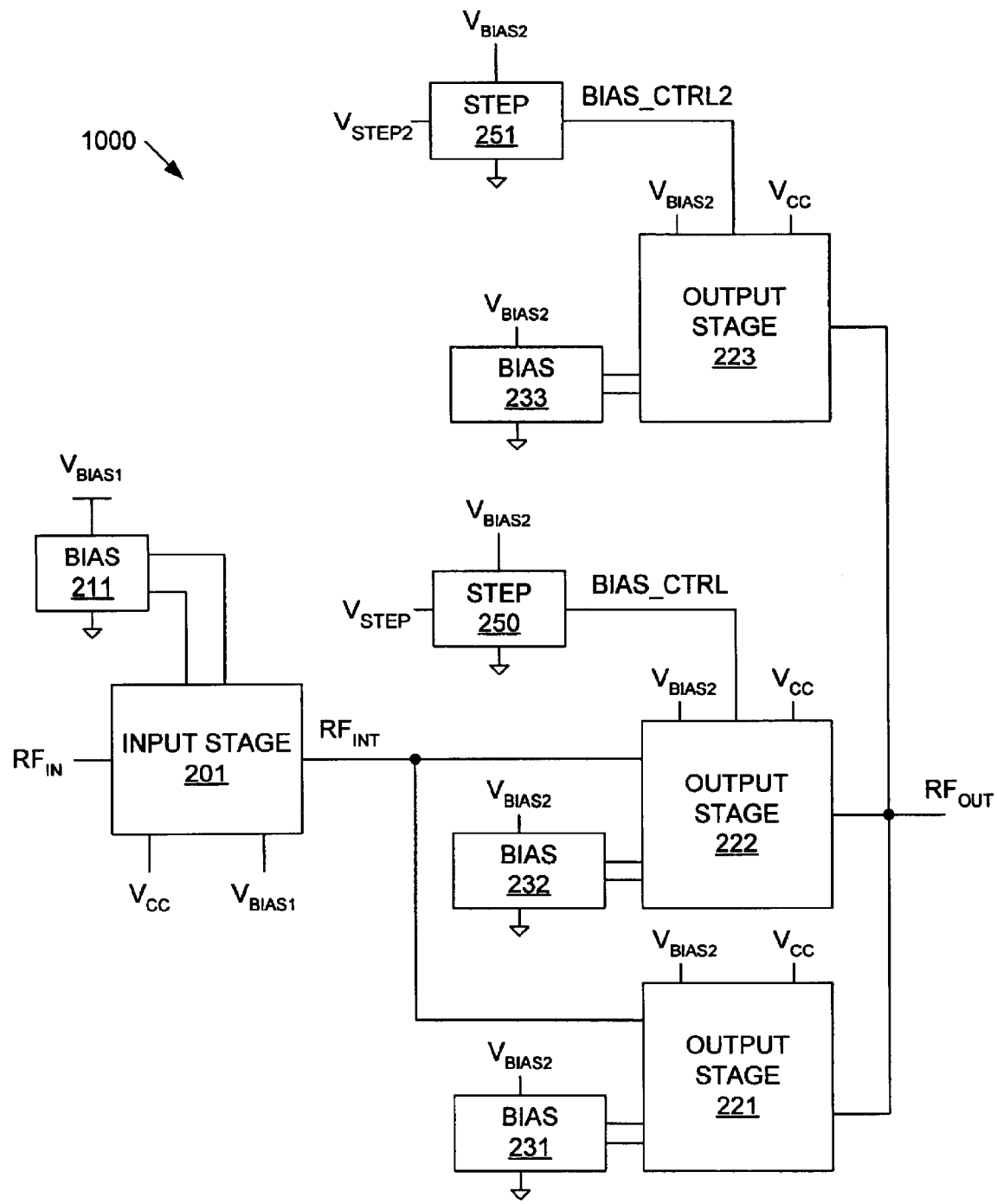
FIG. 10 is a block diagram of a power amplifier having three output stages, in accordance with one embodiment of the present invention.

In another variation, a power amplifier can be created using more than two parallel output stages. FIG. 10 is a block diagram of a power amplifier 1000 having three parallel output stages, in accordance with one embodiment of the present invention. In addition to the above-described elements of power amplifier 200, power amplifier 1000 includes third amplifier output stage 223, bias control circuit 233 and step control circuit 251. Amplifier output stage 223, bias control circuit 233 and step control circuit 251 are similar to output stage 222, bias control circuit 232 and step control circuit 250, respectively. However, in the described embodiment, amplifier output stage 223 has more output stages than amplifier output stage 222. Step control circuit 251 operates in response to a second step control signal $V_{STEP2}$. Thus, step control circuit 251 operates independent of step control circuit 250. Power amplifier 100 advantageously allows for more than two power operating states. In the lowest power state, only amplifier output stage 221 is enabled. In a first power state, only amplifier output stages 221 and 222 are enabled. In a second power state, only amplifier output stages 221 and 223 are enabled. In a high power state, all amplifier output stages 221–223 are enabled.

In an alternate embodiment, the functionality of step control circuits 250 and 251 can be combined in a single control circuit. The present embodiment can also be extended to more than three parallel amplifier output stages.

The technique of the present invention can be used in different types of power amplifiers, including but not limited to, code division multiple access (CDMA) power amplifiers, wideband code division multiple access (WCDMA) power amplifiers, and enhanced data rates for GSM evolution (EDGE) power amplifiers.

Although the invention has been described in connection with several embodiments, it is understood that this invention is not limited to the embodiments disclosed, but is capable of various modifications, which would be apparent to one of ordinary skill in the art. For example, although amplifier input stage 201, and amplifier output stage 221 and amplifier output stage 222 have been described as having certain numbers of parallel RF transistors (i.e., 2, 4 and 12, respectively), it is understood that these amplifier stages can have other numbers of parallel RF transistors in other embodiments. Thus, the invention is limited only by the following claims.

I claim:

1. A power amplifier capable of operating in a high power mode and a low power mode, the power amplifier comprising:

a first amplifier output stage configured to receive a radio frequency (RF) input signal, wherein the first amplifier output stage is enabled during both the high power mode and the low power mode, and wherein the first amplifier output stage comprises:
   a first set of transistors, each having a control electrode coupled to receive the RF input signal;
   a first set of distributed bias circuits, wherein the control electrode of each of the transistors in the first set of transistors is coupled to a corresponding distributed bias circuit in the first set of distributed bias circuits; and
   a first common bias reference circuit coupled to each of the distributed bias circuits in the first set of distributed bias circuits;

a second amplifier output stage configured to receive the RF input signal; and a control circuit coupled to the second amplifier output stage, wherein the control circuit is configured to enable the second amplifier output stage during the high power mode, and wherein the control circuit is configured to disable the second amplifier output stage during the low power mode.

2. The power amplifier of claim 1, wherein the second amplifier output stage comprises:
   a second set of transistors, each having a control electrode coupled to receive the RF input signal;
   a second set of distributed bias circuits, wherein the control electrode of each of the transistors in the second set of transistors is coupled to a corresponding distributed bias circuit in the second set of distributed bias circuits; and
   a second common bias reference circuit coupled to each of the distributed bias circuits in the second set of distributed bias circuits.

3. The power amplifier of claim 2, wherein there are more transistors in the second set of transistors than in the first set of transistors.

4. The power amplifier of claim 2, wherein the first set of distributed bias circuits and the first common bias reference circuit form a first set of temperature adaptive bias circuits, and wherein the second set of distributed bias circuits and the second common bias reference circuit form a second set of temperature adaptive bias circuits.

5. A power amplifier capable of operating in a high power mode and a low power mode, the power amplifier comprising:
   a first amplifier output stage configured to receive a radio frequency (RF) input signal, wherein the first amplifier output stage is enabled during both the high power mode and the low power mode;
   a second amplifier output stage configured to receive the RF input signal, wherein the second amplifier output stage comprises:
      a plurality of transistors, each having a control electrode coupled to receive the RF input signal; and
      a bias reference circuit configured to provide DC bias voltages to the control electrodes of each of the plurality of transistors; and
   a control circuit coupled to the second amplifier output stage, wherein the control circuit is configured to enable the second amplifier output stage during the high power mode, and wherein the control circuit is configured to disable the second amplifier output stage during the low power mode.

6. The power amplifier of claim 5, wherein the control circuit comprises circuitry for forcing the DC bias voltages to a level that will turn off the plurality of transistors.

7. The power amplifier of claim 5, wherein the bias reference circuit comprises a common bias reference circuit that is common to each of the plurality of transistors, and a plurality of distributed bias circuits, each associated with a corresponding one of the plurality of transistors.

8. A method of operating a power amplifier comprising:
   receiving a radio frequency (RF) input signal with a first amplifier output stage and a second amplifier output stage;
   enabling the first amplifier output stage and disabling the second amplifier output stage during a low power operating mode of the power amplifier;
   enabling the first amplifier output stage and the second amplifier output stage during a high power operating mode of the power amplifier;
   biasing a first set of transistors in the first amplifier output stage with a common bias reference circuit and a plurality of distributed bias circuits; and
   biasing a second set of transistors in the second amplifier output stage with a common bias reference circuit and a plurality of distributed bias circuits.

9. The method of claim 8, wherein there are more transistors in the second set of transistors than in the first set of transistors.

10. A method of operating a power amplifier comprising:
    receiving a radio frequency (RF) input signal with a first amplifier output stage and a second amplifier output stage;
    enabling the first amplifier output stage and disabling the second amplifier output stage during a low power operating mode of the power amplifier;
    enabling the first amplifier output stage and the second amplifier output stage during a high power operating mode of the power amplifier;
    biasing a first set of transistors in the first amplifier output stage in a temperature adaptive manner; and
    biasing a second set of transistors in the second amplifier output stage in a temperature adaptive manner.

11. A power amplifier capable of operating in a high power mode and a low power mode, the power amplifier comprising:
    a first amplifier output stage configured to receive a radio frequency (RF) input signal;
    a second amplifier output stage configured to receive the RF input signal;
    means for enabling the first amplifier output stage during the low power mode and the high power mode;
    means for enabling the second amplifier output stage during the high power mode, and disabling the second amplifier output stage during the low power mode;
    means for biasing a first set of transistors in the first amplifier output stage with a common bias reference circuit and a plurality of distributed bias circuits; and
    means for biasing a second set of transistors in the second amplifier output stage with a common bias reference circuit and a plurality of distributed bias circuits.

12. A power amplifier capable of operating in a high power mode and a low power mode, the power amplifier comprising:
    a first amplifier output stage configured to receive a radio frequency (RF) input signal, wherein the first amplifier output stage comprises a first set of transistors having control electrodes configured to receive the RF input signal;
    a second amplifier output stage configured to receive the RF input signal, wherein and the second amplifier output stage comprises a second set of transistors having control electrodes configured to receive the RF input signal, wherein there are more transistors in the second set of transistors than in the first set of transistors;
    means for enabling the first amplifier output stage during the low power mode and the high power mode; and
    means for enabling the second amplifier output stage during the high power mode, and disabling the second amplifier output stage during the low power mode.

13. A power amplifier capable of operating in a high power mode and a low power mode, the power amplifier comprising:
    a first amplifier output stage configured to receive a radio frequency (RF) input signal;
    a second amplifier output stage configured to receive the RF input signal;
    means for enabling the first amplifier output stage during the low power mode and the high power mode;
    means for enabling the second amplifier output stage during the high power mode, and disabling the second amplifier output stage during the low power mode;
    means for biasing a first set of transistors in the first amplifier output stage in a temperature adaptive manner; and
    means for biasing a second set of transistors in the second amplifier output stage in a temperature adaptive manner.

* * * * *